United States Patent
Ahn et al.

(10) Patent No.: US 7,799,377 B2
(45) Date of Patent: Sep. 21, 2010

(54) ORGANIC/INORGANIC THIN FILM DEPOSITION METHOD

(75) Inventors: Seong Deok Ahn, Daejeon (KR); Seung Youl Kang, Daejeon (KR); Chul Am Kim, Seoul (KR); Ji Young Oh, Daejeon (KR); In Kyu You, Daejeon (KR); Gi Heon Kim, Daejeon (KR); Kyu Ha Baek, Daejeon (KR); Kyung Soo Suh, Daejeon (KR)

(73) Assignee: Electronics and Telecommunications Research Institute, Daejeon (KR)

( * ) Notice: Subject to any disclaimer, the term of this patent is extended or adjusted under 35 U.S.C. 154(b) by 209 days.

(21) Appl. No.: 11/950,606

(22) Filed: Dec. 5, 2007

(65) Prior Publication Data

US 2008/0138517 A1    Jun. 12, 2008

(30) Foreign Application Priority Data

Dec. 7, 2006    (KR) ............... 10-2006-0123964

(51) Int. Cl.
C23C 16/455    (2006.01)
(52) U.S. Cl. .............. 427/255.23; 427/255.6; 117/88; 117/91
(58) Field of Classification Search ............ 427/255.23, 427/255.6; 117/88, 91
See application file for complete search history.

(56) References Cited

U.S. PATENT DOCUMENTS

| | | | |
|---|---|---|---|
| 6,358,863 B1 | 3/2002 | Desu et al. | |
| 6,391,803 B1 * | 5/2002 | Kim et al. | 438/787 |
| 6,669,990 B2 * | 12/2003 | Min et al. | 427/255.31 |
| 6,787,185 B2 * | 9/2004 | Derderian et al. | 427/255.25 |

(Continued)

FOREIGN PATENT DOCUMENTS

JP    2006-140853    6/2006

(Continued)

OTHER PUBLICATIONS

Keranen, Jetta, et al., "Preparation by atomic layer deposition and characterization of active sites in nanodispersed vanadia/titania/silica catlysts". Catalysis Today 91-92 (2004) pp. 67-71.*

(Continued)

*Primary Examiner*—Bret Chen
(74) *Attorney, Agent, or Firm*—Ladas & Parry LLP

(57) ABSTRACT

Provided is a method for depositing an organic/inorganic thin film. The method includes: i) heating a source vessel containing an organic material and an inorganic material; ii) transferring a deposition gas to a process chamber; iii) distributing the deposition gas onto a substrate disposed in the process chamber; iv) purging the process chamber; v) heating an activating agent source vessel; vi) transferring a heat initiator gas phase to the process chamber; vii) distributing the heat initiator gas phase onto the organic or inorganic material monomer deposited on the substrate through the process chamber, and forming an organic/inorganic thin film; and viii) exhausting the heat initiator gas phase and purging the process chamber. Depositing the organic/inorganic thin film in a time-division manner, the thickness of the thin film can be accurately adjusted and the deposition can be uniformly performed when the thin film is deposited on a large-scale substrate.

5 Claims, 2 Drawing Sheets

U.S. PATENT DOCUMENTS

| | | |
|---|---|---|
| 7,354,849 B2 * | 4/2008 | Plombon et al. ............ 438/597 |
| 2002/0081441 A1 | 6/2002 | Desu et al. |
| 2004/0151845 A1 | 8/2004 | Nguyen et al. |
| 2008/0241358 A1 * | 10/2008 | Joe et al. ................... 427/96.8 |

FOREIGN PATENT DOCUMENTS

| | | |
|---|---|---|
| KR | 1020030015096 | 2/2003 |
| KR | 102005054154 | 6/2005 |
| WO | WO99/22043 | 5/1999 |

OTHER PUBLICATIONS

Justin F. Gaynor, et al.; "Optical properties of polymeric thin films grown by chemical vapor deposition;" Journal of Materials Research, vol. 11, No. 1, Jan. 1996, pp. 236-242.

* cited by examiner

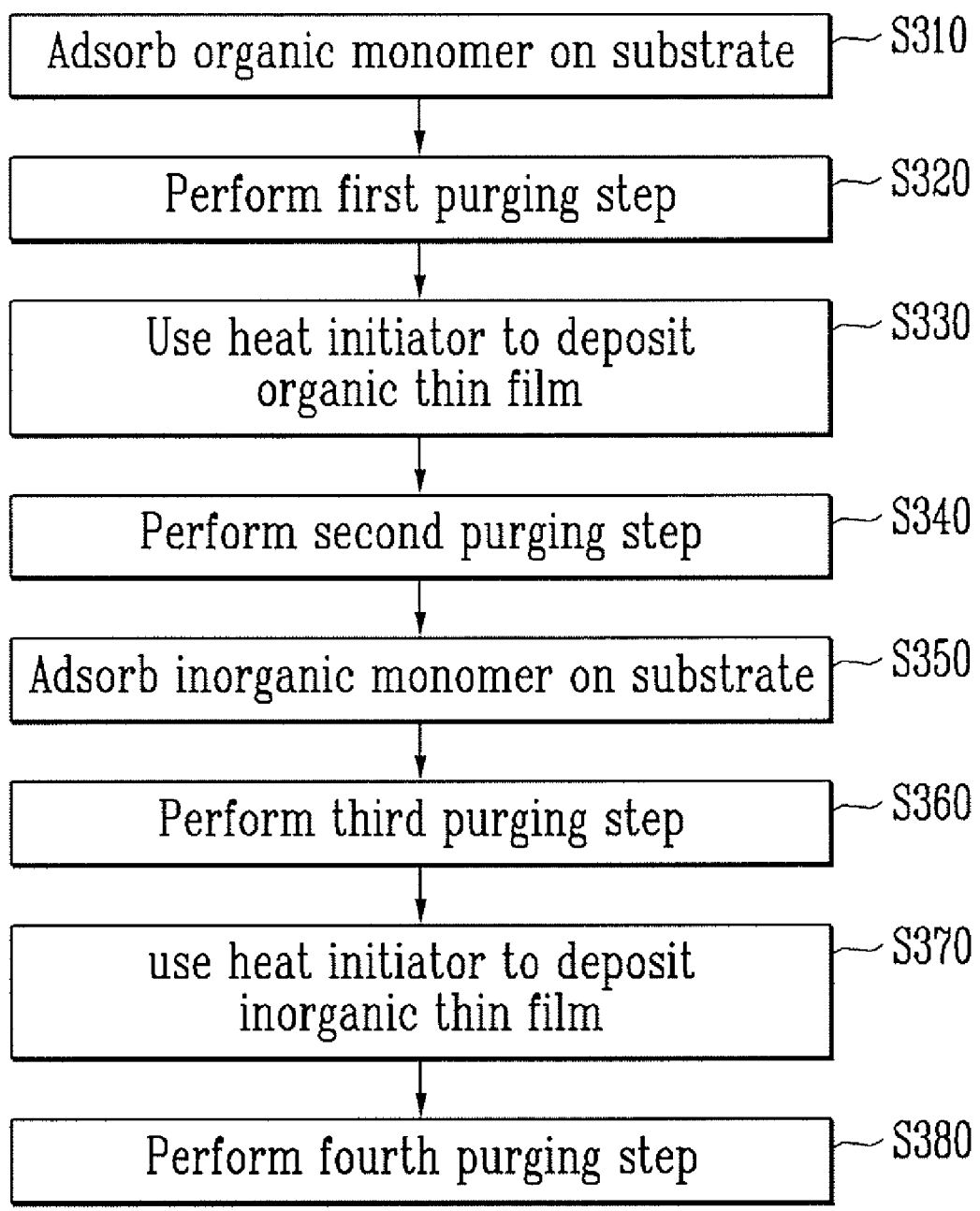

ORGANIC/INORGANIC THIN FILM DEPOSITION METHOD

CROSS-REFERENCE TO RELATED APPLICATION

This application claims priority to and the benefit of Korean Patent Application No. 2006-123964, filed Dec. 7, 2006, the disclosure of which is incorporated herein by reference in its entirety.

BACKGROUND

1. Field of the Invention

The present invention relates to a method and device for depositing an organic/inorganic thin film or an organic/inorganic element in a time-division manner, and more particularly, to a method and device for depositing an organic/inorganic thin film to be uniformly formed on a large area at a low pressure using a time-divisional deposition way.

The present invention has been produced from the work supported by the IT R&D program of MIC (Ministry of Information and Communication)/IITA (Institute for Information Technology Advancement) [2005-S070-02, Flexible Display] in Korea.

2. Discussion of Related Art

In general, representative methods for forming a polymer thin film, a polymer element, and so forth include a spin-coating method and an ink-jet method, both of which do not use a vacuum deposition device, and a vacuum deposition method which uses a polymer chemical vapor deposition (CVD) device. Among these vacuum deposition methods, the polymer CVD method using the polymer CVD device has a process somewhat similar to the existing CVD method, but it differs significantly in that it has a pyrolysis chamber enabling a raw material for deposition to be pyrolyzed between a source vessel containing a raw material for deposition and a deposition chamber where the deposition is performed. Hereinafter, a method of forming a polymer thin film will be described in detail with reference to FIG. 1.

FIG. 1 is a schematic view of a conventional polymer CVD device for forming a polymer thin film using a polymer CVD method. Referring to FIG. 1, the polymer CVD device includes a deposition chamber 1 where deposition is performed on a substrate 2, a source vessel 4 receiving a polymer material, a pyrolysis chamber 3 disposed between the deposition chamber 1 and the source vessel 4 to pyrolyze the polymer material gas phase, and a vacuum pump 5 for maintaining a vacuum in the deposition chamber 1. Here, a container of the source vessel 4 receiving the polymer material to be deposited in the deposition chamber usually has a circular or rectangular shape, the source vessel 4 is made of stainless steel such as SUS, and the container forming the source vessel 4 is wound by a heater (not shown) having a constant shape.

The procedure of a deposition process using the above-described conventional polymer CVD device is as follows. A vacuum pump (not shown) connected to the deposition chamber 1 is first used to keep an internal pressure of the deposition chamber 1 at a desired degree of vacuum. The temperature of the source vessel 4 where the polymer material is received is then raised to vaporize the polymer material, and in particular, when a predetermined power is applied to the source vessel 4, the heater wound around the container is heated to raise not only the temperature around the source vessel 4 and but also the source vessel 4, so that the source vessel has a constant temperature, thereby causing the polymer material to be vaporized by a predetermined amount of vapor pressure. The temperature of the source vessel 4 is measured by a thermocouple (not shown) disposed in the source vessel 4, which can be constantly adjusted to obtain a desired vaporization speed of the polymer material.

The vaporized polymer material gas phases are then transferred to the pyrolysis chamber 3 to be pyrolyzed at a high temperature, so that the phases are decomposed to a desired gas phase material, i.e., a desired monomer material. Such monomer materials are then transferred to the deposition chamber 1 and condensed on the cooled substrate 2 to cause polymerization, thereby starting to solidify the materials on the substrate 2 to form a polymer thin film.

However, according to the conventional polymer CVD device, it is difficult to adjust an amount of the polymer material gas phase to be pyrolyzed in the pyrolysis chamber, and so the deposition speed and the thickness of the thin film cannot be precisely adjusted, which causes a deposition rate to deteriorate. After the deposition process is performed, it is burdensome to expose the deposition chamber to the air in order to remove the polymer thin film deposited on an internal wall of the deposition chamber 1, which not only lowers mass productivity but also makes it difficult to obtain a thin film of high quality.

SUMMARY OF THE INVENTION

The present invention is directed to a method and device for depositing an organic/inorganic thin film, which includes a source vessel containing organic/inorganic materials, and a catalyst source vessel containing a heat initiator for activating the materials so that the thickness of the organic/inorganic thin film can be accurately adjusted, and high quality organic/inorganic thin film can be fabricated and brought into the market.

The present invention is also directed to a method and device for depositing an organic/inorganic thin film, which prevents a source from being deposited on an inner wall of a deposition chamber to enhance mass productivity.

One aspect of the present invention provides a method of depositing an organic/inorganic thin film in a time-division manner, which comprises: i) heating a source vessel containing an organic material and an inorganic material to generate at least one deposition gas phase of the organic and inorganic materials; ii) transferring one of the deposition gas phases of the organic and inorganic materials to a process chamber through a transfer path maintaining a constant temperature so as to prevent the generated deposition gas phases of the organic/inorganic materials from being condensed; iii) distributing one of the deposition gas phases of the organic and inorganic materials transferred to the process chamber onto a substrate disposed in the process chamber to adsorb one of the organic and inorganic materials on the substrate; iv) purging the process chamber using a diluted gas and a transfer gas after one of the organic and inorganic materials is adsorbed on the substrate; v) heating an activating agent source vessel containing an activation heat initiator capable of activating a monomer of one of the deposition gas phases of the organic and inorganic materials to generate a heat initiator gas phase; vi) transferring the heat initiator gas phase to the process chamber through a transfer path maintaining a constant temperature so as to prevent the heat initiator gas phase from being condensed; vii) distributing the heat initiator gas phase transferred to the process chamber onto the organic or inorganic material monomer deposited on the substrate through the process chamber maintaining a constant temperature so as to prevent the heat initiator gas phase from being condensed in a shower head, and forming an organic/inorganic thin film;

and viii) exhausting the heat initiator gas phase remaining after the organic/inorganic thin film is deposited on the substrate from the process chamber, and purging the process chamber using the diluted gas and the transfer gas.

Steps iii), iv), vii), and viii) may be repeatedly performed when an additional organic/inorganic thin film or a multi-component thin film is formed on the substrate where the organic/inorganic thin film has been already formed. The process chamber may have a deposition pressure of 0.001 torr to 100 torr. The shower head disposed in the process chamber may uniformly supply the organic/inorganic materials, the heat initiator, and the diluted gas which are transferred by the transfer gas at a low pressure. The diluted gas and the transfer gas used for depositing the organic/inorganic materials may be inactive gases.

Another aspect of the present invention provides a device for depositing an organic/inorganic thin film in a time-division manner, which comprises: a deposition unit including a process chamber, a substrate support disposed in the process chamber and supporting the substrate, a temperature adjustment unit disposed in the substrate support and adjusting the temperature of the substrate, and a shower head alternately supplying a deposition source gas phase and an activating agent source gas phase to be used for deposition of the organic/inorganic thin film onto the substrate; a source unit including at least one deposition source vessel receiving a deposition source for supplying the deposition source gas phase to the shower head, at least one activating agent source vessel receiving an activating agent source for supplying the activating agent source gas phase to the shower head, a transfer gas supply source supplying a transfer gas for transferring the deposition source gas phase to the process chamber, a diluted gas supply source supplying a diluted gas to the process chamber, a heating unit heating the deposition source vessel and the activating agent source vessel so as to generate the deposition source gas phase from the deposition source vessel and the activating agent gas phase from the activating agent source vessel, and a plurality of transfer paths allowing the deposition source gas phase and the activating agent source gas phase to be selectively transferred to the shower head based on the time division and being heated by the heating unit; a flow adjustment unit introducing the deposition source gas phase for organic/inorganic materials, the activating agent source gas phase, the transfer gas and the diluted gas into the process chamber, and adjusting the amount and speed of the deposition source gas phase for organic/inorganic materials, the activating agent source gas phase, the transfer gas, and the diluted gas; a plurality of valves disposed in the respective transfer paths for time-dividing the deposition source gas phase for organic/inorganic materials, the activating agent source gas phase, the transfer gas, and the diluted gas to be introduced into the process chamber; and a vacuum pump making a vacuum state of the process chamber constant.

The shower head may be comprised of a plurality of plates, and include at least one hole having a diameter of 0.01 mm to 50 mm. The shower head may be made of stainless steel or quartz, which is not deformed at a high temperature. A removable shower curtain may be disposed in the shower head along a radius direction of the shower head. The deposition source vessels and the activating agent source vessels may be used to form a multi-component organic/inorganic thin film.

BRIEF DESCRIPTION OF THE DRAWINGS

The above and other features and advantages of the present invention will become more apparent to those of ordinary skill in the art by describing in detail preferred embodiments thereof with reference to the attached drawings in which:

FIG. 3 is a flowchart illustrating a time-division method of depositing an organic/inorganic thin film using an organic/inorganic thin film deposition device according to an exemplary embodiment of the present invention.

DETAILED DESCRIPTION OF PREFERRED EMBODIMENTS

The present invention will now be described more fully hereinafter with reference to the accompanying drawings, in which preferred embodiments of the invention are shown. This invention may, however, be embodied in different forms and should not be construed as limited to the embodiments set forth herein. Rather, these embodiments are provided so that this disclosure is thorough and complete and fully conveys the scope of the invention to those skilled in the art.

Figure 1:
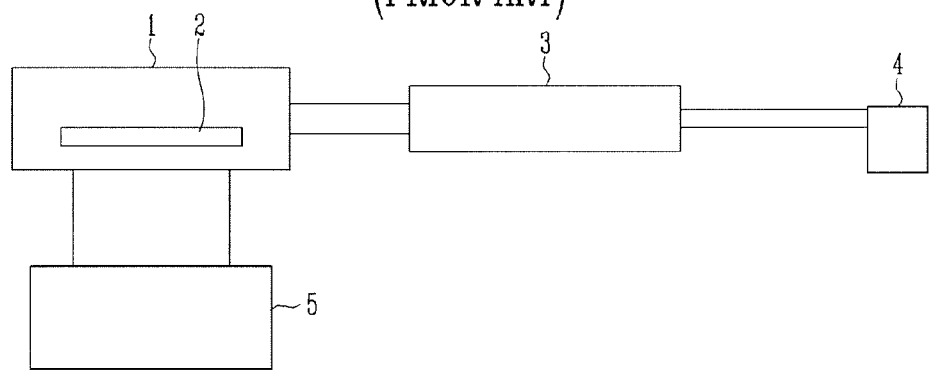
FIG. 1 is a schematic view of a conventional deposition device using a polymer CVD method.
Figure 2:
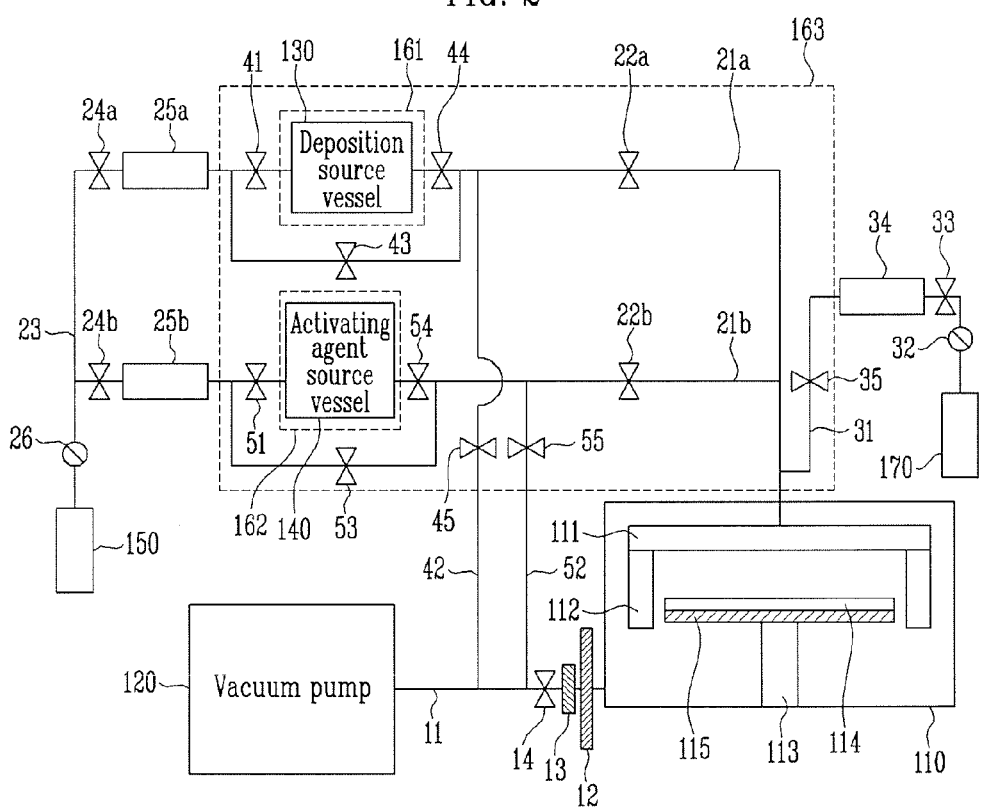
FIG. 2 is a schematic view of an organic/inorganic thin film deposition device according to an exemplary embodiment of the present invention.

FIG. 2 is a schematic view of an organic/inorganic thin film deposition device according to an exemplary embodiment of the present invention. Referring to FIG. 2, the organic/inorganic thin film deposition device according to an exemplary embodiment of the present invention includes a process chamber 110, a vacuum pump 120, a deposition source vessel 130, an activating agent source vessel 140, heating units 161, 162 and 163, a transfer gas supply source 150, a diluted gas supply source 170, and flow adjustment units 25a and 25b. Hereinafter, these components will be described in detail.

The process chamber 110 is a place where deposition of the organic/inorganic thin film is performed, and includes a shower head 111 disposed at an upper side in the process chamber 110, a shower curtain 112 disposed at an end of the shower head 111, a substrate support 114 disposed on a substrate support axis 113 to be opposite to the shower head 111, and a substrate temperature adjustment unit 115 disposed below the substrate support 114 and adjusting the temperature of the substrate support 114. The shower head 111 has a circular or square shape which can uniformly supply a composite of organic/inorganic materials, an activating agent heat initiator, and a diluted gas, which are transferred by a transfer gas at a low pressure. The shower curtain 112 can be removably disposed along the radius of the shower head 111, which enables a diameter ratio of the shower head 111 to the substrate support 114 to be adjusted. The shower head 111 formed of stainless steel, quartz, or the like which is not deformed at a high temperature, may be comprised of 1 to 5 plates, and may have a plurality of holes (not shown) for injecting the materials. Here, the holes may have a diameter of 0.01 mm to 50 mm.

The vacuum pump 120 for maintaining a vacuum state of the process chamber 110 at a predetermined level is connected to one side of the process chamber 110. The vacuum pump 120 is usually a rotary pump and can supply a pressure of 0.001 torr to about 100 torr. Also, the vacuum pump 120 may further include a turbo pump for enhancing the vacuum degree of the process chamber 110. A vacuum exhaust path 11 is connected between the vacuum pump 120 and the process chamber 110, a trap 12, a throttle valve 13, and a quick switching valve 14 for the process chamber are disposed at one side of the vacuum exhaust path 11. By way of example, when a by-product formed of a component of a thin film remains after the thin film is formed and a turbo pump is used as the vacuum pump 120, the trap 12 is introduced in the form of a cold-trap for selectively removing a by-product (e.g., vapor) showing a negative effect on the performance of the turbo pump. That is, the remaining by-products are condensed in the trap 12 to prevent the vacuum pump 120 from being deteriorated without forming the thin film. The trap 12 is basically filled with liquid nitrogen, natural oil, or fluorocarbon oil.

The throttle valve 13 disposed at a back end of the trap 12 is located at the exhaust path 11 near the location where the process chamber 110 and the exhaust path 11 are connected to each other. The quick switching valve 14, at a time of bypassing, acts to perform switching between the path for the process chamber 110 and the path for the bypassing, and is selectively closed to prevent bypass gases or gas phases from flowing into the process chamber 110 when reactive gases or gas phases are directly bypassed through the exhaust path 11 without entering the process chamber 110, and is selectively opened when vacuum exhaust occurs from the process chamber 110. Such operations of the quick switching valve 14 for the process chamber are controlled depending on time as the thin film deposition is performed in a time-division manner.

The deposition source vessel 130 is a component which supplies gas phases (e.g., gas phases of a deposition source material for forming a thin film) of a process material to the process chamber 110 where a vacuum state is formed by the vacuum pump 120, and a plurality of deposition source vessels may be disposed according to the number of organic/inorganic deposition materials when the thin film requires a plurality of organic/inorganic deposition materials. The deposition source vessel 130 is connected to the process chamber 110 through a deposition source gas phase transfer path 21a. When a plurality of deposition source vessels 130 are disposed, a plurality of deposition source gas phase transfer paths 21a of branch types may be combined with the process chamber 110 so as to make the deposition source vessels 130 alternately supply different kinds of gas phases of organic/inorganic deposition materials or source.

The quick switching valve 22a is disposed at each central portion of the deposition source gas phase transfer paths 21a in the front end of the location where the deposition source gas phase transfer paths 21a of the branch type are combined, so as to selectively supply the gas phases of the deposition source to the process chamber 110 or selectively supply the gas phase of the selected deposition source to the process chamber 110 only for a predetermined time in a time-division manner.

Also, the deposition source vessel 130 is connected to a transfer gas supply source 150 through a transfer gas transfer path 23 for supplying the transfer gas to the deposition source vessel 130. When a plurality of deposition source vessels 130 are disposed, they can be branched in parallel from the transfer gas transfer paths 23, and a quick switching valve 24a as a valve for selectively distributing the transfer gas and a regular valve 26 for supplying the transfer gas are disposed at each of the transfer gas transfer paths 23. A flow adjustment unit 25a is disposed in the transfer gas transfer path 23 to accurately control the flow amount of the transfer gas. A plurality of flow adjustment units 25a may also be disposed based on the number of the deposition source vessels 130.

Examples of the transfer gas supplied from the transfer gas supply source 150 may include nitrogen, helium, argon, krypton, xenon, neon, and so forth as inactive gases. The transfer gas moves through the deposition source vessel 130 and floats the gas phase of the organic/inorganic deposition source vaporized in the deposition source vessel 130 to transfer it to the process chamber 110. The deposition source vessel 130 vaporizes the organic/inorganic deposition materials or source to be deposited to generate the gas phase of the organic/inorganic deposition source, and allows the gas phase of the organic/inorganic deposition source to be transferred to the process chamber 110 by the transfer gas.

In order to deposit the thin film, not only the deposition source but also an activating agent source, e.g., a heat initiator capable of activating a monomer or single molecule should be sequentially supplied to the process chamber 110. Accordingly, for the heat initiator capable of activating the monomer or single molecule, e.g., a source vessel containing the heat initiator, i.e., an activating agent source vessel 140 is disposed parallel to the deposition source vessel 130 in the device for depositing the organic/inorganic composite thin film in accordance with the embodiment of the present invention.

An activating agent gas phase transfer path 21b is disposed between the activating agent source vessel 140 and the process chamber 110 in order to supply a gas phase of the activating agent to the process chamber 110. Such an activating agent gas phase transfer path 21b is combined with the deposition source gas phase transfer path 21a in the location adjacent to the process chamber 110. Accordingly, in order to supply the activating agent to the process chamber 110 to be divided from the organic/inorganic deposition source gas phase supplied through the deposition source gas phase transfer path 21a, a switching valve, e.g., a quick switching valve 22b for supplying an activating agent is disposed in the middle of the activating agent gas phase transfer path 21b.

Such sequential operations or time-divisional operations of the quick switching valves 22a and 22b enable the gas phase of the deposition source and the gas phase of the activating agent to be supplied to the process chamber 110 in a sequential manner or a time-division manner. The transfer gas transfer path 23 is disposed between the transfer gas supply source 150 and the activating agent source vessel 140 for transferring the activating agent gas phase to the process chamber 110. The above-described transfer gas may be employed for transferring the gas phase of the organic/inorganic deposition source.

A regular valve 26 supplying a transfer gas and a quick switching valve 24b are connected to the activating agent source vessel 140 to uniformly or accurately supply the transfer gas, and a flow adjustment unit 24b is disposed in the middle of the gas transfer path in a back end of the regular valve 26 to accurately control the flow amount of the transfer gas. Meanwhile, the deposition source vessel 130 and the activating agent source vessel 140 are made of quartz or stainless steel such as SUS.

Source vessel heating units 161 and 162 for heating the deposition source vessel 130 and the activating agent source vessel 140 are disposed around the deposition source vessel 130 and the activating agent source vessel 140 to vaporize the organic/inorganic deposition source contained in the deposition source vessel, respectively. Also, a third heating unit 163 is disposed around transfer paths. The first, second, and third heating units 161, 162, and 163 may be controlled independent of each other, or may be interlinked. In particular, the third heating unit 163 heating the transfer paths may be disposed to surround the transfer paths and valves mounted on the transfer paths in order to prevent the deposition source gas phase transferred from the deposition source vessel 130 from being condensed on the transfer path or to prevent the activating agent source from being condensed on the transfer path.

Also, when the deposition source gas phase is supplied to the process chamber 110, a diluted gas supply source 170 for supplying a diluted gas is connected to the process chamber 110 through a diluted gas transfer path 31 and a transfer path connected to the diluted gas transfer path. In order to accurately or uniformly supply the diluted gas to the process chamber 110, a regular valve 32 for supplying the diluted gas is disposed in the middle of the diluted gas transfer path 31, and a flow adjustment unit 34 for the diluted gas is disposed in a front end of the regular valve 32 so that the flow amount of the diluted gas can be accurately controlled. A quick switching valve 33 of the diluted gas line disposed in a back end of the flow adjustment unit 34 is opened or closed to control the supply of the diluted gas, and a quick switching valve 34 for opening and closing the flow adjustment unit is disposed in a front end of the flow adjustment unit 34.

The diluted gas is introduced to adjust the total pressure of the process chamber 110, and supplied to allow an organic/inorganic thin film to be deposited or formed at a low pressure when the deposition source gas phase or the activating agent gas phase is supplied into the process chamber through the transfer path to form the organic/inorganic thin film. Examples of such a diluted gas may include nitrogen, helium, argon, krypton, xenon, neon, and so forth as an inactive gas, and ammonia or methanol as a reactive gas. Hydrogen, which does not react with a polymer material, or an organic material may also be used as the diluted gas. In conclusion, when the organic/inorganic deposition is performed, the quick switching valves 33 and 35 of the diluted gas line are opened to adjust the total pressure inside the process chamber 110.

The gas phase transfer path extending into the process chamber 110 is combined with the front end of the process chamber 110 and is connected to a shower head 111 disposed at an upper side in the process chamber. Accordingly, the gas phase transfer path supplies a reactive gas, e.g., an organic source gas phase to the shower head 111. The shower head 111 distributes the organic/inorganic deposition source gas phase and the activating agent gas phase, which are sequentially introduced in a time-division manner, onto a substrate (not shown) on the substrate support 114 disposed at a lower side in the process chamber 110 to be opposite to the shower head 111, thereby growing and depositing an organic/inorganic thin film on the substrate. The substrate may be formed of metal, semiconductor, insulator, plastic, or the like, and may have any shape including a circle, a square, a rectangle and so forth. In particular, in a case of plastic, it may have a deformed roll-to-roll shape. Such an increase in degree of freedom of the substrate shape is mainly contributed to the fact that the shower head or the like is employed to enable the reactive gas, e.g., a deposition source gas phase, to be uniformly supplied onto a large-scale substrate.

The substrate support axis 113 may act to adjust a distance between the shower head and the substrate. The substrate support axis 113 may be configured to be connected to a motor or the like outside of the process chamber for providing a driving force for rotating, raising, or lowering the substrate support 114. The shower head 111, although not shown in detail, is comprised of a plurality of plates having an internal space into which the reactive gas is to be supplied, and a plurality of injection holes (not shown) are formed in the lowest plate opposite to the substrate support 114, so that the reactive gas is uniformly distributed in each area. In this case, the shower head 111 may be formed of stainless steel or quartz, and may have a circular or rectangular shape.

A temperature adjustment unit 115 is disposed below the substrate support 114 to adjust the temperature of the substrate support 114. The temperature adjustment unit 115, although not shown in detail, has cooling lines, a substrate heating unit, and so forth to adjust the temperature of the substrate by heating and/or cooling the substrate support 114, so that the organic/inorganic deposition source gas phase can be uniformly adsorbed on the substrate, thereby allowing the organic/inorganic thin film to be deposited. Also, the shower curtain 112 disposed at an upper side around the substrate support 114 between the substrate support 114 and the shower head 111 can be removable so that the diameter ratio of the shower head 111 to the substrate support 114 can be changed. The substrate may be formed of metal, semiconductor, insulator, plastic, or the like, and may have any shape including a circle, a square, a rectangle and so forth. In particular, in a case of a plastic substrate, it may have a deformed roll-to-roll shape. Transfer paths which can be heated up to 500° C. are employed as the transfer paths according to the present embodiment, and valves having an accuracy up to 0.05 seconds and capable of being turned on or off are employed as the various valves described in the present embodiment.

In order to deposit the organic/inorganic thin film using the above-described configuration, a bypass step should be performed before a transfer gas is flowed into the deposition source vessel 130 to cause the organic/inorganic deposition source gas phases to be transferred into the process chamber 110 or to cause the activating agent gas phase to be transferred to the process chamber 110. Such a bypass step may bypass the activating agent gas phase, the organic/inorganic deposition source gas phase, or the transfer gas.

The bypassing of the deposition source gas phase will be first described. The bypassing of the deposition source gas phase opens a deposition source-out quick switching valve 41 disposed in a front end of the deposition source vessel 130, a deposition source-in quick switching valve 44, and a deposition source-bypass quick switching valve 45 to bypass the deposition source gas phase. To this end, a first bypass path 42 is disposed to directly connect the deposition source gas phase transfer path 21a to the exhaust path 11. The deposition source-bypass quick switching valve 45 is disposed in the middle of the first bypass path 42 to control opening and closing of the first bypass path 42. After the bypass step is performed, the deposition source-bypass quick switching valve 45 is closed and the deposition source-in quick switching valve 44 is opened, so that the organic/inorganic deposition source gas phase mixed with the transfer gas is supplied to the process chamber 110 through the deposition source gas phase transfer path. Here, the deposition source vessel 130 and all gas transfer path lines subsequent to the first flow adjustment unit 25a may be independently heated by the heating units 161 and 163 of a heating block type, so that condensation during the transfer can be prevented. In this case, the heating units 161 and 163 heat the transfer path and the valves up to 500° C. from a normal temperature.

Bypassing of the activating agent gas phase will be next described. An activating agent source-out quick switching valve 51 disposed in a front end of the activating agent source vessel 140, an activating agent source-in quick switching valve 54, and an activating agent source-bypass quick switching valve 55 are opened to bypass the activating agent source gas phase. To this end, a second bypass path 52 is disposed as a pipe which directly connects the activating agent source gas phase transfer path 21b to the vacuum exhaust path 11. The activating agent source-bypass quick switching valve 55 is disposed in the middle of the second bypass path 52 to control opening and closing of the second bypass path 52. After the bypass is performed, the activating agent source-bypass quick switching valve 55 is closed and the activating agent source-in quick switching valve 54 is opened, so that activating agent mixed with the transfer gas, i.e., a heat initiator gas phase is supplied to the process chamber through the activating agent source gas phase transfer path 21b. Here, the activating agent source vessel 140 and all gas transfer path lines subsequent to the second flow adjustment unit 25b may be independently heated or heated to be interlinked by the heating unit 162 of a heating block type, so that condensation during the transfer can be prevented. In this case, the heating units 162 and 163 heat the transfer path and the valves up to 500° C. from a normal temperature.

Hereinafter, deposition of the organic/inorganic thin film using a device for depositing the organic/inorganic thin film will be described again. When the organic/inorganic thin film is deposited, a heat initiator capable of activating the organic/inorganic gas phase, monomer, or single molecule is bypassed through the source-out quick switching valves 41 and 51, the source-in quick switching valves 44 and 54, and the source-bypass quick switching valves 45 and 55 before the organic/inorganic gas phase contained in the deposition source vessel 130 and the activating agent contained in the activating agent source vessel 140 are transferred into the process chamber 110. The source-bypass quick switching valve 45 is then closed and the source chamber-in quick switching valve 22a is opened to deposit the organic/inorganic gas phase passing the shower head 111 of the process chamber 110 through the transfer path 21a onto a substrate (not shown) disposed on the substrate support 114, thereby forming an organic/inorganic thin film. Temperatures of the deposition source vessel 130 and all transfer paths subsequent to the flow adjustment unit 25a can be independently adjusted by the heating units 161 and 163. Also, the source chamber gas-in quick switching valve 35 of the diluted gas transfer path 31 is opened to adjust the total pressure of the process chamber 110 in order to form the organic/inorganic thin film.

In order to clean pipes between the process chamber and at least one of the deposition source vessel 130 and the activating agent source vessel 140, for example, the deposition source gas phase transfer path 21a or the activating agent gas phase transfer path 21b, the deposition source-out quick switching valve 41 or the activating agent source-out quick switching valve 51 is closed, and deposition source or activating agent-purge quick switching valves 43 and 53 and the process chamber-in quick switching valves 22a and 22b are opened to transfer an appropriate amount of inactive gases, i.e., the transfer gas toward the process chamber 110, so that all by-products remaining in the transfer lines and the process chamber 110 are flowed out of the process chamber 110. To this end, a purge gas transfer path and a separate bypass path directly connecting the transfer gas transfer paths to the gas phase transfer paths are disposed to bypass the deposition source vessel 130 and the activating agent source vessel 140, respectively. Here, a time division method is employed to adjust an exact thickness of the thin film, an amount of pre-processing, or a degree of doping to deposit the organic/inorganic thin film. To this end, quick switching valves having an operating accuracy of 0.01 to 0.05 seconds and being turned on or off are employed as the valves disposed in the middle of the transfer paths to perform opening or closing according to the time division.

FIG. 3 is a flowchart illustrating a method of depositing an organic/inorganic thin film in a time-division manner using an organic/inorganic thin film deposition device according to an exemplary embodiment of the present invention. The procedure of depositing the organic/inorganic thin film using the time division method will be described with reference to FIG. 3, assuming that one organic layer and one inorganic layer are given.

In the first step S310, the source-out quick switching valve 41, the source-in quick switching valve 44, and the source chamber-in quick switching valve 22a, which are connected to the deposition source vessel 130, are opened to supply a gas phase of the organic deposition source, i.e., an organic monomer onto the substrate introduced to the process chamber 110, thereby performing the adsorption.

In the second step S320, a first purge process is performed which opens the source-purge quick switching valve 43 and the source chamber-in quick switching valve 22a to supply only the transfer gas to the process chamber 110 to purge the inside of the process chamber 110, thereby exhausting the remaining organic source gas from the process chamber 110. While the first purge process is performed, the source-out quick switching valve 41, the source-in quick switching valve 44, and the source-bypass quick switching valve 45 are used to transfer the organic material to the vacuum pump 120, thereby keeping a steady state flow.

In the third step S330, the source-out quick switching valve 51, the source-in quick switching valve 54, and the source chamber-in switching valve 22b are opened to input a heat initiator capable of polymerizing the adsorbed organic material to deposit a single-layered organic thin film.

In the fourth step S340, a second purge process is performed which opens the source-purge quick switching valve 53 and the source chamber-in quick switching valve 22b to exhaust the remaining heat initiator from the process chamber 110. While the second purge process is performed, the source-out quick switching valve 51, the source-in quick switching valve 54, and the source-bypass quick switching valve 55 are opened to directly transfer the heat initiator to the vacuum pump 120, thereby keeping a steady state flow. When the above-described four steps S310 to S340 are repeated, an organic thin film of a single component can be deposited.

In the fifth step S350, the deposition source-out quick switching valve 41, the source-in quick switching valve 44, and the source chamber-in quick switching valve 22a are opened to adsorb an inorganic monomer.

In the sixth step S360, a third purge process is performed which opens the source-purge quick switching valve 43 and the source chamber-in quick switching valve 22a to supply only the transfer gas to the process chamber 110 to purge the inside of the process chamber 110, thereby exhausting the remaining heat inorganic source gas phase from the process chamber 110. While the third purge process is performed, the source-out quick switching valve 41, the source-in quick switching valve 44, and the source-bypass quick switching valve 45 are opened to transfer an inorganic material to the vacuum pump 120, thereby keeping a steady state flow.

In the seventh step S370, the source-out quick switching valve 51, the source-in quick switching valve 54, and the source chamber-in switching valve 22b are opened to input a heat initiator capable of polymerizing the adsorbed monomer, thereby depositing an inorganic thin film of a single layer.

In the eighth step S380, a fourth purge process is performed which opens the source-purge quick switching valve 53 and the source chamber-in quick switching valve 22b to exhaust the remaining heat initiators from the process chamber 110. While the fourth purge process is performed, the source-out quick switching valve 51, the source-in quick switching valve 54, and the source-bypass quick switching valve 55 are opened to directly transfer the heat initiators to the vacuum pump 120, thereby keeping a steady state flow. When the above-described four steps S350 to S380 are repeated, an inorganic thin film of a single component can be deposited.

Repeating the above steps, an organic/inorganic thin film can be obtained. The method of depositing the organic/inorganic thin film in a time-division manner can very accurately adjust the thickness of the organic/inorganic thin film.

According to a novel method and device for depositing an organic/inorganic thin film in a time-division manner as described above, the thickness of the organic/inorganic thin film can be precisely adjusted and the deposition can be uniformly performed when the organic/inorganic thin film is deposited on a large-scale substrate. Also, the thickness and composition of organic/inorganic thin films can be accurately adjusted when at least one organic/inorganic thin film is deposited.

Although exemplary embodiments of the present invention have been described with reference to the attached drawings, the present invention is not limited to these embodiments, and it will be appreciated by those skilled in the art that a variety of modifications and changes can be made without departing from the spirit and scope of the present invention.

What is claimed is:

1. A method of depositing organic and inorganic composite thin film in a time-division manner, comprising:
   i) heating a source vessel containing an organic material and an inorganic material to generate at least one deposition gas phase of the organic and inorganic materials;
   ii) transferring one of the deposition gas phases of the organic and inorganic materials to a process chamber through a transfer path maintaining a constant temperature so as to prevent the transferred deposition gas phase from being condensed;
   iii) distributing one of the deposition gas phases of the organic and inorganic materials transferred to the process chamber onto a substrate disposed in the process chamber to adsorb one of the organic and inorganic materials on the substrate;
   iv) purging the process chamber using a diluted gas and a transfer gas after one of the organic and inorganic materials is adsorbed on the substrate;
   v) heating an activating agent source vessel containing an activation heat initiator capable of activating a monomer of one of the deposition gas phases of the organic and inorganic materials to generate a heat initiator gas phase;
   vi) transferring the heat initiator gas phase to the process chamber through a transfer path maintaining a constant temperature so as to prevent the heat initiator gas phase from being condensed;
   vii) distributing the heat initiator gas phase transferred to the process chamber onto the organic or inorganic material monomer deposited on the substrate through the process chamber maintaining a constant temperature so as to prevent the heat initiator gas phase from being condensed in a shower head, and forming organic and inorganic composite thin film; and
   viii) exhausting the heat initiator gas phase remaining after the organic and inorganic composite thin film is deposited on the substrate from the process chamber, and purging the process chamber using the diluted gas and the transfer gas.

2. The method according to claim 1, wherein steps iii), iv), vii) and viii) are repeatedly performed when an additional organic and inorganic composite thin film or a multi-component thin film is formed on the substrate where the organic and inorganic composite thin film is already formed.

3. The method according to claim 1, wherein the process chamber has a deposition pressure of 0.001 torr to 100 torr.

4. The method according to claim 1, wherein the shower head disposed in the process chamber uniformly supplies at least one of the organic and inorganic materials, the heat initiator, and the diluted gas which are transferred by the transfer gas at a low pressure.

5. The method according to claim 1, wherein the diluted gas and the transfer gas used for depositing at least one of the organic and inorganic materials are inactive gases.

* * * * *